(12) United States Patent
Ondricek

(10) Patent No.: US 8,350,191 B2
(45) Date of Patent: Jan. 8, 2013

(54) PROBE CARD THERMAL CONDITIONING SYSTEM

(75) Inventor: Douglas S. Ondricek, Dallas, TX (US)

(73) Assignee: FormFactor, Inc., Livermore, CA (US)

( * ) Notice: Subject to any disclaimer, the term of this patent is extended or adjusted under 35 U.S.C. 154(b) by 1056 days.

(21) Appl. No.: 12/267,735

(22) Filed: Nov. 10, 2008

(65) Prior Publication Data

US 2009/0289050 A1    Nov. 26, 2009

Related U.S. Application Data

(60) Provisional application No. 61/054,829, filed on May 21, 2008.

(51) Int. Cl.
*F24C 7/10* (2006.01)
*B65D 85/00* (2006.01)

(52) U.S. Cl. ........ 219/386; 219/394; 219/395; 219/400; 219/402; 219/413; 206/710

(58) Field of Classification Search .................. 219/386, 219/390, 394, 395, 400, 402, 413; 206/710
See application file for complete search history.

(56) References Cited

FOREIGN PATENT DOCUMENTS

| JP | 2004-266206 | * | 9/2004 |
|---|---|---|---|
| JP | 2004266206 | | 9/2004 |

* cited by examiner

*Primary Examiner* — Shawntina Fuqua
(74) *Attorney, Agent, or Firm* — Kirton McConkie

(57) ABSTRACT

Embodiments of apparatus for thermally conditioning probe cards prior to use in a testing system are provided herein. In some embodiments, a probe card thermal conditioning system may include an enclosure configured to support a probe card and a heat transfer element disposed proximate a bottom of the enclosure for thermally conditioning the probe card prior to installation in a prober. The heat transfer element may be a heating and/or cooling element. A controller may be provided for controlling operation of the heat transfer element, optionally with temperature feedback. Multiple enclosures may be provided for independently conditioning multiple probe cards. The enclosure may be contained in a cart or may be part of shipping container for shipping a probe card. A fan may be provided for circulating air within the enclosure. The fan may facilitate providing a dry purge gas to prevent condensate from forming on the probe card.

28 Claims, 2 Drawing Sheets

PROBE CARD THERMAL CONDITIONING SYSTEM

CROSS-REFERENCE TO RELATED APPLICATIONS

This application claims benefit of U.S. provisional patent application Ser. No. 61/054,829, filed May 21, 2008, which is herein incorporated by reference.

BACKGROUND OF THE INVENTION

1. Field of the Invention

The present invention generally relates to semiconductor testing systems, and more particularly, to probe card thermal conditioning in such testing systems.

2. Description of the Related Art

When testing partially or fully completed semiconductor devices formed on a semiconductor substrate, such as integrated circuits and the like, a plurality of contact elements, or probes, are typically brought into contact with the device to be tested—sometimes referred to as a device under test (or DUT). The probes are typically part of a probe card assembly (or probe card) or other similar device coupled to a test mechanism (such as a prober) that brings the probe probes into contact with terminals on the DUT to facilitate providing electrical signals to the DUT in accordance with a predetermined testing protocol.

Such testing often can occur at high temperatures, for example up to about 150 degrees Celsius, which might require a preheat time for the probe card to reach a steady state suitable to begin testing of the DUT. However, delays while waiting for the probe card to heat up can be costly and reduce availability of the equipment for testing. Moreover, the probe card may have a large mass (for example, due to stiffening members or assemblies for ensuring alignment of the probes extending from the probe card), which further exacerbates this problem because a large mass takes longer to heat or cool.

Accordingly, there is a need for an apparatus for use in testing semiconductor devices that can reduce the time required to heat and/or cool a probe card.

SUMMARY OF THE INVENTION

Embodiments of methods and apparatus for thermally conditioning probe cards prior to use in a testing system are provided herein. In some illustrative, non-limiting embodiments, a probe card thermal conditioning system for thermally conditioning a probe card prior to installation in a prober may include a housing; an enclosure disposed within the housing and configured to support a probe card in a position above a bottom of the enclosure; and a heat transfer element disposed proximate the bottom of the enclosure for thermally conditioning the probe card prior to installation in a prober. The enclosure may be insulated. In some embodiments, the heat transfer element may be a heating element. In some embodiments, the heat transfer element may be a cooling element. A controller may be provided for controlling the operation of the heat transfer element. A feedback loop may be provided for monitoring the probe card temperature. Multiple enclosures may be provided for independently conditioning multiple probe cards. In some embodiments, the enclosure may be contained in a cart. The cart may have anti-static wheels. The enclosure may also be part of shipping container for shipping a probe card. In some embodiments, a shipping container may be configured to slide into the enclosure. The heat transfer element may be part of the shipping container. In some embodiments, a fan may be provided for circulating air within the enclosure. In some embodiments, the fan may facilitate providing a dry purge gas, such as dry air, nitrogen ($N_2$), or the like, to prevent condensate from forming on the probe card.

In some embodiments, a method of thermally conditioning a probe card prior to installation in a prober may include inserting a probe card in an enclosure disposed within a housing and having a heat transfer element disposed proximate a bottom of the enclosure for thermally conditioning the probe card prior to installation in a prober; and bringing the probe card to a desired temperature while in the enclosure.

BRIEF DESCRIPTION OF THE DRAWINGS

So that the manner in which features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate elements that are common to the figures. The images used in the drawings may be simplified for illustrative purposes and are not necessarily depicted to scale.

DETAILED DESCRIPTION

This specification describes exemplary embodiments and applications of the invention. The invention, however, is not limited to these exemplary embodiments and applications or to the manner in which the exemplary embodiments and applications operate or are described herein. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one or more of the listed elements by itself or in any combination.

Embodiments of the invention include providing a probe card thermal conditioning system for heating and/or cooling a probe card external to a prober. In all embodiments depicted below, the probe card thermal conditioning system is external to a prober. The environment of the thermal conditioning system may be configured to emulate the thermal environment inside the prober. The thermal conditioning system may be provided in any suitable form, such as a mobile cart form, a table top form, a fixture, a shipping or carrying case, or the like. In some embodiments, the thermal conditioning system may be provided in part by a shipping or carrying case that may also interface with an external cart or other fixture such that, together, the shipping or carrying case and the external cart or other fixture define the thermal conditioning system. In some embodiments, multiple zones for conditioning multiple probe cards may be provided. Controls may be provided for one or more of on/off or control of the heat transfer element, heat transfer element power, safety interlocks, probe card temperature feedback loop, or the like.

Figure 1:
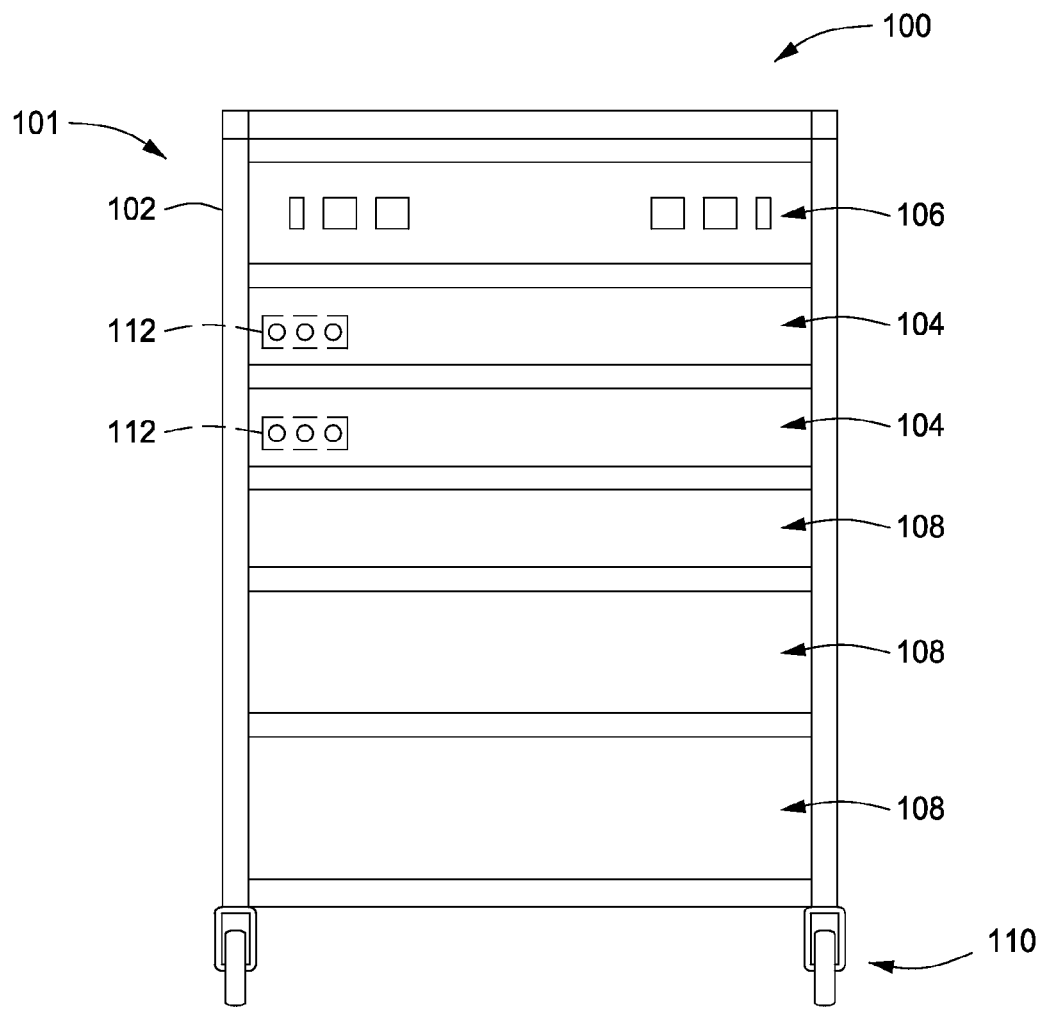
FIG. 1 depicts a schematic diagram of a probe card thermal conditioning system in accordance with some embodiments of the present invention.

For example, in a non-limiting illustrative example, a probe card thermal conditioning system 100 is depicted in FIG. 1. The probe card thermal conditioning system 100 may include a housing 102, at least one enclosure 104 configured to house a probe card (two enclosures 104 depicted in FIG. 1), and a controller 106 for controlling operation of the probe card thermal conditioning system 100. In embodiments where multiple enclosures 104 are provided, each enclosure may be independent of the other and separately controlled.

Figure 3:
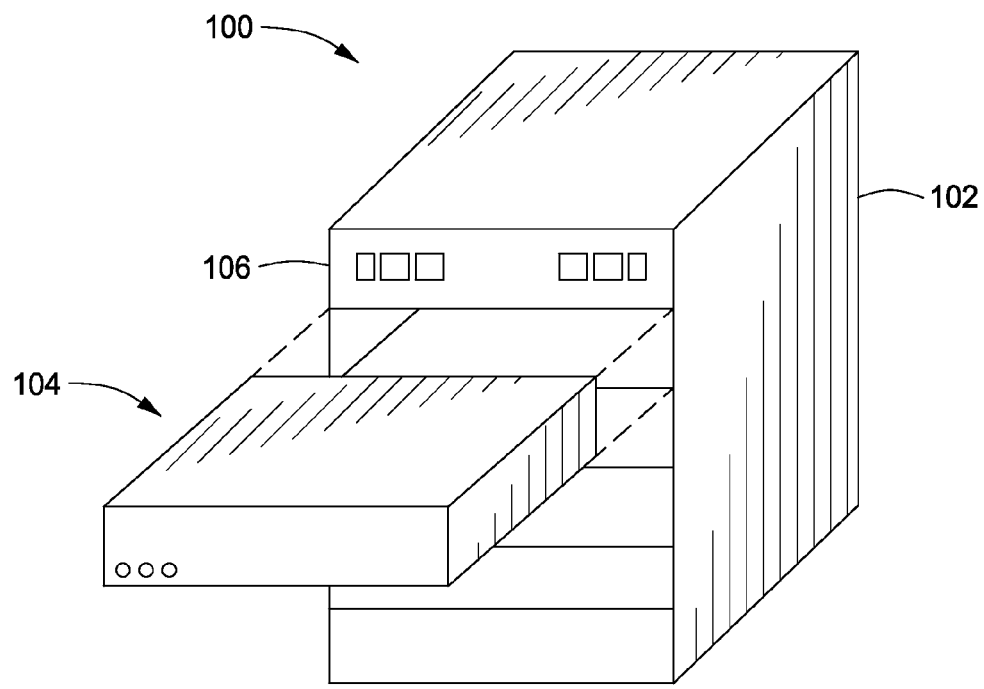
FIG. 3 depicts a perspective view of a probe card thermal conditioning system in accordance with some embodiments of the present invention.

Each enclosure 104 is configured to provide a thermal conditioning environment for heating and/or cooling a probe card when disposed within the enclosure 104. The environment may be configured to emulate the thermal environment inside a prober, thereby facilitating temperature control of a probe card remote from the prober. To provide access to the interior of the enclosure for inserting and removing a probe card therefrom, the enclosure 104 may be configured to slide at least partially in and out of the housing 102. For example, FIG. 3 depicts a perspective view of a probe card thermal conditioning system in accordance with some embodiments of the present invention having an enclosure 104 that may be completely removed from the housing 102. In some embodiments, guiderails (not shown) may be provided to facilitate alignment and reduce friction during the movement of the enclosure 104. In some embodiments, the enclosure 104 may be configured to only be partially extended from the housing to a sufficient degree to allow access for inserting or removing a probe card from the housing. In some embodiments, the enclosure 104 may be stationary with respect to the housing 102 and other access means may be provided. For example, the enclosure 104 may be disposed in an uppermost position in the housing 102 (and the controller 106 disposed beneath the enclosure 104) and may be provided with a lid that may be opened to provide access to the interior of the enclosure 104.

Due to the high thermal mass of the probe card, the heat transfer from the probe card during the move from the thermal conditioning system to the prober may be minimal. In some embodiments, the heat transfer from the probe card may be sufficiently small to allow for immediate use of the probe card upon installation in the prober. In some embodiments, the probe card may be heated and/or cooled to a temperature that compensates for any additional thermal transfer during the move of the probe card from the thermal conditioning system to the prober. As such, the thermal conditioning system may advantageously provide greater uptime for the prober due to lessening the time required for subsequent heating and/or cooling of a probe card once installed within the prober, and/or utilizing the prober for other testing while a probe card is being thermally conditioned outside of the prober.

Figure 2:
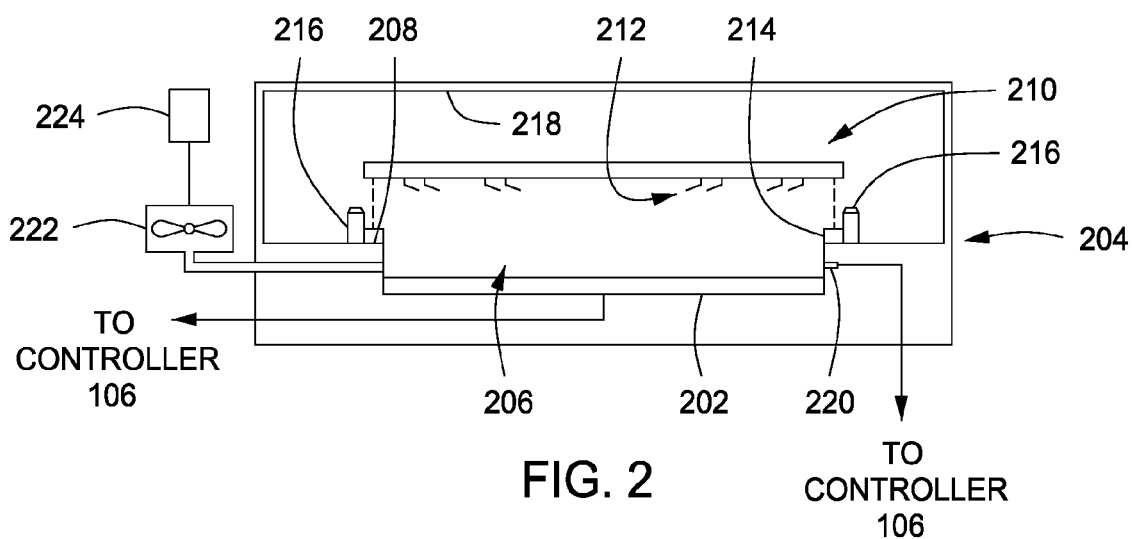
FIG. 2 depicts a probe card housing of a probe card thermal conditioning system in accordance with some embodiments of the present invention.

For example, FIG. 2 schematically depicts a partial side view of an enclosure 204 (similar to enclosure 104) having a heat transfer element 202 disposed within a lower portion of the enclosure 204. The heat transfer element 202 may have a size and geometry that corresponds with a chuck of a prober. In some embodiments, the heat transfer element 202 may provide heating and/or cooling. In some embodiments, the heat transfer element 202 may have multiple zones that may be controlled independently.

In some embodiments, the heat transfer element 202 may be configured to be disposed directly opposite a probe card when installed in the probe card thermal conditioning system (e.g., with no intervening components, such as a wafer or the like, that might be present in a prober), In some embodiments, the heat transfer element 202 may be disposed within a recess 206 within the enclosure 204 having a ledge 208 disposed thereabout. The ledge 208 may be configured to correspond with and support a peripheral edge of a probe card 210 when disposed therein. A plurality of locating features (such as pins 216) may be provided to facilitate aligning the probe card 210 above the heat transfer element 202. The locating features 216 may be configured to interlock with the probe card 210 or may be configured to substantially prevent lateral movement of the probe card 210 with respect to the enclosure 204 once inserted therein.

The recess 206 may be sized to accept any protruding features extending from a lower surface of the probe card 210, such as probes 212. For example, the recess may be sized to allow the probes 212 to come into close proximity to the heat transfer element 202, without contacting the heat transfer element 202, thereby facilitating more rapid transfer of thermal energy between the heat transfer element 202 and the probe card 210 (including the probes 212) while minimizing the risk of damage to the probes 212 or other elements of the probe card 210 due to contact with the heat transfer element 202.

In some embodiments, the heat transfer element 202 may be positionally adjustable to facilitate control over the distance between the heat transfer element 202 and the probe card 210, and/or to facilitate use of the enclosure 204 with probe cards having different depth requirements. In some embodiments, one or more features, such as a spacer 214 may be provided to increase the distance between the probe card 210 and the heat transfer element 202, for example, to facilitate use of the same enclosure 204 with a variety of probe cards having differing protrusion depths (e.g., having probes that extend from the probe card by differing amounts). The spacer 214 may be a ring or may be a plurality of individual spacers. In some embodiments, multiple spacers may be provided to facilitate use of the enclosure 204 with multiple probe cards.

At least a portion of the enclosure 204 may be insulated to minimize undesired thermal transfer from the enclosure 204 to the atmosphere or components outside of the enclosure 204 (such as another enclosure, the controller, the air in the room, or the like). For example, insulation (such as a liner 218 disposed proximate the outer walls of the enclosure, a thermal blanket disposed atop the probe card, or the like) may be provided to minimize undesired thermal transfer. The insulation may be provided in the enclosure 204 (such as the liner 218 shown in FIG. 2) or in the housing that retains the enclosure 204 (such as the housing 102 shown in FIG. 1). The insulation may be permanent or removable.

In some embodiments, a fan 222 may be provided to facilitate circulating air within the enclosure 204. In some embodiments, the fan 222 may be coupled to a source 224 of a dry gas (such as dry air, nitrogen ($N_2$), or the like). The circulation of the dry gas may facilitate reducing the formation of condensate on the probe card 210, or components thereof (such as probes 212) when the heat transfer element 202 operates to cool the probe card 210, which may limit the formation of oxides on, for example, probes 212.

In some embodiments, the enclosure 204 may further include one or more thermocouples 220 (or other temperature reading element) for providing a signal indicative of the temperature of at least one of the heat transfer element 202, the atmosphere within the enclosure 204 (or within the recess 206), the probe card 210 (or probes 212), or the like. The thermocouple 220 may be coupled to the controller 106 for providing a feedback loop regarding the temperature being monitored by the thermocouple 220. In some embodiments, the thermocouple 220 may be provided at part of the probe card 210 and may be coupled to the controller 106 when the probe card 210 is inserted into the enclosure 204, thereby providing a consistent assembly point for temperature measurements that may reduce run-to-run temperature variations.

Returning to FIG. 1, the controller 106 may be configured to provide and/or control at least one of power on/off of the system 100 or individual enclosures 104, respective temperatures of each enclosure 104, safety interlocks, probe card temperature feedback loops, indicia of the temperature or of the relation of the temperature to a predetermined set point, or the like. The controller 106 may be any suitable controller, such as a computer having a CPU, memory, and support circuits. A single controller 106 may be utilized for each enclosure 104, or separate controllers may be provided. In some embodiments, the controller 106 may be dedicated to the probe card thermal conditioning system 100 and is not configured for testing or other functions that may be performed by a prober.

In some embodiments, each enclosure 104 may include a display 112 for indicating the state of the enclosure 104 of the probe card thermal conditioning system 100 (e.g., power on/off, temperature of the enclosure—or of a heat transfer element or a probe card disposed within the enclosure—temperature at set point, or the like). The display 112 may include lights, readouts, alarms, or the like for readily conveying the desired information to an operator of the thermal conditioning system or to another controller (not shown) that may be controlling the operation of the thermal conditioning system in combination with other components of a test system (such as other thermal conditioning systems, one or more probers, or the like). For example, lights may indicate power on/off, heat transfer element on/off, probe card (or components thereof) at temperature set point, or the like. In some embodiments, the display 112 may include a readout of the temperature of the heat transfer element, the probe card (or components thereof), or the like. Although referred to as a display, the display 112 may be, or may include, an audible alarm or other audible notification of the aforementioned states of the enclosure 104. In some embodiments, the display 112, may be located proximate the controller 106 rather than on the enclosure 104 as depicted in FIG. 1.

In some embodiments, the housing 102 may further include at least one shelf 108 (three shelves 108 depicted in FIG. 1). Each shelf 108 may be configured for storing associated equipment or articles (such as probe card packaging or other protective materials, spare parts or components of the probe card or the probe card thermal conditioning system 100, or the like). The shelves 108 may further be configured to house additional optional equipment such as fans, additional probe card enclosures 104, or the like, for modular expansion or alteration of the probe card thermal control system 100 as desired.

In some embodiments, and as depicted in FIG. 1, the thermal conditioning system 100 may be provided in a mobile cart form. For example, the housing 102 may have a plurality of wheels, or casters 110 to facilitate moving the cart when desired. In some embodiments, the casters 110 may be lockable, or some other locking or braking device may be provided to facilitate securing the thermal conditioning system 100 from movement when desired. In some embodiments, the casters 110 may be antistatic to prevent or minimize any build-up, or subsequent discharge, of a static electric charge.

Although shown as a mobile cart in FIG. 1, the thermal conditioning system 100 may be provided in any suitable form, such as a table top form, a fixture, a shipping or carrying case, or the like. In some embodiments, thermal conditioning system 100 may be formed in part by a shipping or carrying case for a probe card (or a portion of such a shipping or carrying case) that may be combined with an external cart or other fixture such that, together, the shipping or carrying case and the external cart or other fixture define the thermal conditioning system.

For example, in some embodiments, a probe card may be shipped in a container that at least partially defines the enclosure of the thermal conditioning system (such as enclosure 104 shown in FIG. 1 or enclosure 204 shown in FIG. 2). Upon receipt of the probe card, excess or protective packaging, if any, may be removed. The probe card, still retained in the shipping container (or portion thereof), may slide or otherwise interface with another portion of the thermal conditioning system to form the enclosure for the probe card. The heat transfer element of the enclosure may be provided in the shipping container or in some other portion of the housing 102 that forms the enclosure in combination with the shipping container. For example, in some embodiments, the enclosure 104 shown in FIG. 3 may be a shipping container, or part of a shipping container, for the probe card and may be inserted into the housing 102 during use.

Figure 4:
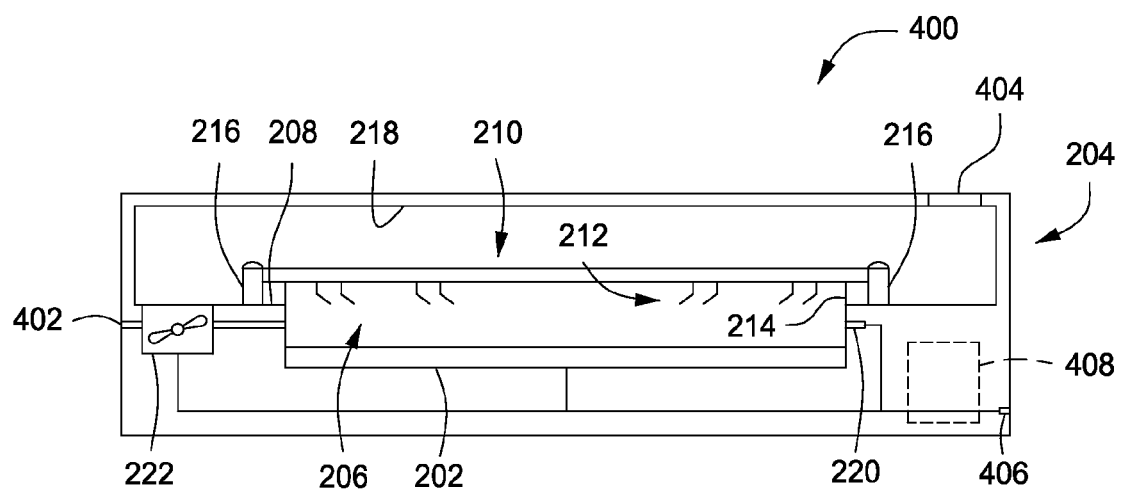
FIG. 4 depicts a probe card thermal conditioning system in accordance with some embodiments of the present invention.

In some embodiments, the probe card thermal conditioning system may be completely provided in a shipping container for a probe card. For example, FIG. 4 depicts a shipping container 400 having the probe card 210 disposed therein. The shipping container 400 may be configured to provide one or more of the benefits described above with respect to the enclosure 104, as discussed above. For example, in some embodiments, the shipping container 400 may include a housing defining the enclosure 204 and having the heat transfer element 202 disposed therein. The heat transfer element 202 may be disposed within the recess 206. The probe card 210 may be supported by the ledge 208 disposed about the recess 206. A plurality of locating features (such as pins 216) may be provided to facilitate aligning the probe card 210 above the heat transfer element 202. The locating features 216 may be configured to interlock with the probe card 210 (not shown) or may be configured to substantially prevent lateral movement of the probe card 210 with respect to the enclosure 204 once inserted therein. In some embodiments, one or more features, such as spacer 214 may be provided to increase the distance between the probe card 210 and the heat transfer element 202, for example, to facilitate use of the same shipping container 400 with a variety of probe cards having differing protrusion depths (e.g., having probes that extend from the probe card by differing amounts).

The enclosure 204 may be insulated to minimize undesired thermal transfer. For example, a liner 218 disposed proximate the outer walls of the enclosure, a thermal blanket disposed atop the probe card (not shown), or other suitable insulation may be provided. The insulation may be permanent or removable. In some embodiments, one or more thermocouples 220 (or other temperature reading element) may be provided for providing a signal indicative of the temperature of at least one of the heat transfer element 202, the atmosphere within the enclosure 204 (or within the recess 206), the probe card 210 (or probes 212), or the like. In some embodiments, a fan 222 may be provided to facilitate circulating air within the enclosure 204. A connector 402 may be provided to facilitate coupling the fan 222 to a source of a dry gas (such as dry air, nitrogen (N₂), or the like).

A display 404 may be provided, for example, in a lid of the housing of the shipping container 400 or on some other external surface thereof, for indicating the state of the enclosure 204 (e.g., power on/off, a temperature reading from one or more thermocouples, or the like). The display 404 may be similar to the display 112 discussed above with respect to FIG. 1. In some embodiments, the display may be powered by an internal source of power, such as a battery, so that the display 404 may be operational when the shipping container 400 is not coupled to any other source of power.

One or more connectors 406 may be provided to facilitate connecting components of the shipping container 400 to external devices, such as a controller, a source of power, or the like. For example, one or more of the fan 222, the heat transfer element 202, the thermocouples 220, the display 404, or the like may be coupled to a source of power and/or a controller via the one or more connectors 406. Alternatively, in some embodiments, a controller 408 may be provided in the shipping container 400, as shown by dashed lines in FIG. 4. The controller 408 may be similar to the controller 106 for controlling operation of the probe card thermal conditioning system.

As illustrative non-limiting examples of some embodiments in accordance with the present invention, a probe card thermal conditioning system may be provided having an enclosure configured to house a probe card and a heat transfer element disposed proximate a bottom of the enclosure and configured to emulate a prober chuck. The enclosure may be insulated. In some embodiments, the heat transfer element may be a heater. In some embodiments, the heat transfer element may be a cooling element. A controller may be provided for controlling the operation of the heat transfer element. A feedback loop may be provided for monitoring the probe card temperature. Multiple enclosures may be provided for independently conditioning multiple probe cards. In some embodiments, the enclosure may be contained in a cart. The cart may have anti-static wheels. The enclosure may also be part of shipping container for shipping a probe card. The shipping container may be configured to slide into the enclosure. The heat transfer element may be part of the shipping container. In some embodiments, a fan may be provided for circulating air within the enclosure. In some embodiments, the fan may facilitate providing a dry purge gas, such as dry air, nitrogen (N₂), or the like, to prevent condensate from forming on the probe card and/or to prevent oxides from forming on probe surfaces.

While the foregoing is directed to embodiments of the present invention, other and further embodiments of the invention may be devised without departing from the basic scope thereof, and the scope thereof is determined by the claims that follow.

The invention claimed is:

1. A probe card thermal conditioning system for thermally conditioning a probe card prior to installation in a prober, comprising:
    a housing;
    an enclosure disposed within the housing, the enclosure sized and configured to hold a probe card inside the enclosure; and
    a heat transfer element disposed inside the enclosure for thermally conditioning the probe card prior to installation of the probe card in a prober in which a device under test (DUT) is to be tested.

2. The system of claim 1, wherein the enclosure is insulated.

3. The system of claim 1, wherein the heat transfer element further comprises:
    a heater.

4. The system of claim 1, wherein the heat transfer element further comprises:
    a cooling element.

5. The system of claim 1, further comprising:
    a controller for controlling the operation of the heat transfer element.

6. The system of claim 5, further comprising:
    a temperature monitor for monitoring the probe card temperature coupled to the controller.

7. The system of claim 1, further comprising:
    a plurality of enclosures disposed in the housing, each enclosure configured to house a probe card and having a heat transfer element disposed proximate a bottom of the respective enclosure for independently conditioning the plurality of probe cards.

8. The system of claim 1, wherein the housing is part of a cart.

9. The system of claim 8, wherein the cart has anti-static wheels.

10. The system of claim 1, wherein the enclosure is at least partially removable from the housing.

11. The system of claim 1, wherein the enclosure is removable from the housing and further comprises a container for shipping and/or storing a probe card.

12. The system of claim 11, wherein the heat transfer element is part of the container.

13. The system of claim 1, further comprising:
    a controller configured to provide and/or control at least one of power on/off of the system or individual enclosures, a temperature of the enclosure, a safety interlock, a probe card temperature feedback loop, or an indicia of the temperature or of the relation of the temperature of either of the enclosure or the probe card to a predetermined set point.

14. The system of claim 1, wherein the enclosure further comprises:
    a recess; and
    a ledge disposed about the recess and configured to support an edge of the probe card such that probes disposed on a bottom surface of the probe card extend into the recess towards the heat transfer element.

15. The system of claim 14, further comprising:
    a spacer configured to sit on the ledge for controlling a distance of the probes from the heat transfer element.

16. The system of claim 14, further comprising:
    a plurality of locating features disposed on the ledge for positioning the probe card with respect to the recess.

17. The system of claim 1, further comprising:
    a fan configured to circulate air within the enclosure.

18. The system of claim 17, further comprising:
    a purge gas source coupled to the enclosure, wherein the purge gas comprises dry purge gas.

19. The system of claim 18, wherein the purge gas comprises at least one of dry air or nitrogen (N.sub.2).

20. The system of claim 1, further comprising:
    at least one shelf disposed in the housing.

21. The system of claim 1, wherein the housing and the enclosure are part of a shipping container for transporting a probe card.

22. The system of claim 21, wherein the shipping container further comprises:

a controller for controlling the operation of the heat transfer element;

a temperature monitor for monitoring the probe card temperature coupled to the controller; and a display for indicating a state of the thermal conditioning system.

23. The system of claim 22, further comprising:

a fan configured to circulate air within the enclosure.

24. A method of thermally conditioning a probe card prior to installation in a prober, comprising:

inserting a probe card in an enclosure disposed within a housing and having a heat transfer element disposed proximate a bottom of the enclosure for thermally conditioning the probe card prior to installation in a prober;

bringing the probe card to a desired temperature while in the enclosure;

removing the probe card from the enclosure after reaching the desired temperature; and inserting the probe card within a prober to test a device.

25. The method of claim 24, wherein bringing the probe card to the desired temperature comprises:

heating the probe card.

26. A method of thermally conditioning a probe card prior to installation in a prober, comprising:

inserting a probe card in an enclosure disposed within a housing and having a heat transfer element disposed proximate a bottom of the enclosure for thermally conditioning the probe card prior to installation in a prober; and bringing the probe card to a desired temperature while in the enclosure, wherein bringing the probe card to the desired temperature comprises:

cooling the probe card.

27. The method of claim 26, further comprising:

circulating air or a dry gas within the enclosure to limit condensate formation on probes of the probe card.

28. A method of thermally conditioning a probe card prior to installation in a prober, comprising:

inserting a probe card into an enclosure at a first location, wherein the enclosure is disposed within a housing and having a heat transfer element disposed proximate a bottom of the enclosure for thermally conditioning the probe card prior to installation in a prober;

shipping the probe card within the enclosure to a second location; and bringing the probe card to a desired temperature while in the enclosure at the second location.

* * * * *